United States Patent [19]
Karasawa et al.

[11] Patent Number: 5,119,934
[45] Date of Patent: Jun. 9, 1992

[54] TRANSPORT CARRIER TAPE WITH INTEGRAL COMPONENT ENGAGING MEANS

[75] Inventors: Yoichi Karasawa; Shosaku Imai, both of Minowa, Japan

[73] Assignee: Seiko Epson Corporation, Japan

[21] Appl. No.: 553,784

[22] Filed: Jul. 13, 1990

[30] Foreign Application Priority Data

Jul. 14, 1989 [JP] Japan .................. 1-181982

[51] Int. Cl.⁵ .............................................. B65D 85/42
[52] U.S. Cl. .............................. 206/330; 206/332
[58] Field of Search .......................... 206/328–333, 206/820; 29/117, 832, 840, 845

[56] References Cited

U.S. PATENT DOCUMENTS

| | | | |
|---|---|---|---|
| 3,133,637 | 5/1964 | Siegler | 206/329 |
| 3,171,535 | 3/1965 | Harris | 206/331 |
| 4,354,337 | 10/1982 | Mori et al. | 53/559 |
| 4,406,367 | 9/1983 | Bouwknegt | 206/329 |
| 4,480,384 | 11/1984 | Bolzt et al. | 29/832 |
| 4,600,971 | 7/1986 | Rose et al. | 206/330 |
| 4,611,262 | 9/1986 | Galloway et al. | 206/330 |
| 4,631,897 | 12/1986 | Slavicek | 206/330 |
| 4,702,370 | 10/1987 | Honda | 206/331 |
| 4,753,061 | 6/1988 | Braden et al. | 53/471 |
| 4,760,916 | 8/1988 | Kaneko et al. | 206/329 |
| 4,852,737 | 8/1989 | Noll | 206/329 |
| 4,898,275 | 2/1990 | Skrtic et al. | 206/330 |

FOREIGN PATENT DOCUMENTS

| | | | |
|---|---|---|---|
| 2551364 | 5/1977 | Fed. Rep. of Germany | 206/329 |
| 0856739 | 12/1960 | United Kingdom | 206/329 |
| 1526785 | 9/1978 | United Kingdom | 206/329 |

*Primary Examiner*—Jimmy G. Foster
*Attorney, Agent, or Firm*—W. Douglas Carothers, Jr.

[57] ABSTRACT

A component supporting transport carrier tape has a plurality of spatially positioned recesses along the longitudinal length of the tape and comprises integral component engaging means to firmly hold and support electrical or electronic components for maintained accurate alignment relative to the transport carrier tape recesses and sprocket holes and for removal from the transport carrier tape and final assembly into a product. The integral component engaging means provides for minimal engagement with the electronic component within the tape recess, which engagement is sufficient to hold the component with minimal contact with and coverage of the component body but with sufficient surface engagement to hold the component securely in proper positional relationship and axial alignment relative to component removal means to provide for its accurate, aligned removal by such means and assembly into product.

16 Claims, 4 Drawing Sheets

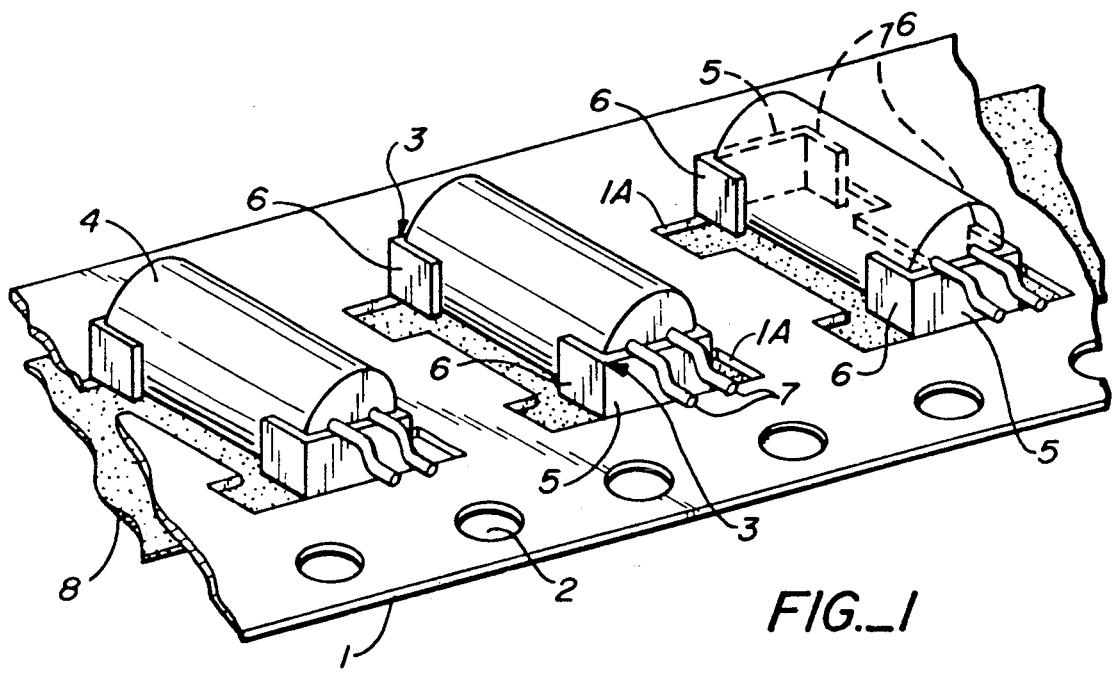
FIG._1
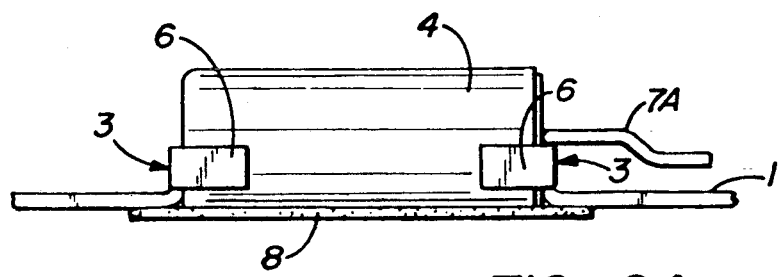
FIG._2A
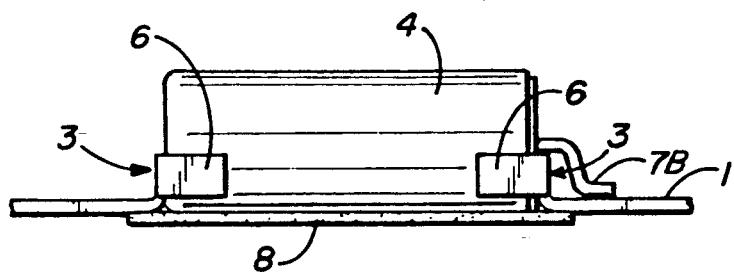
FIG._2B

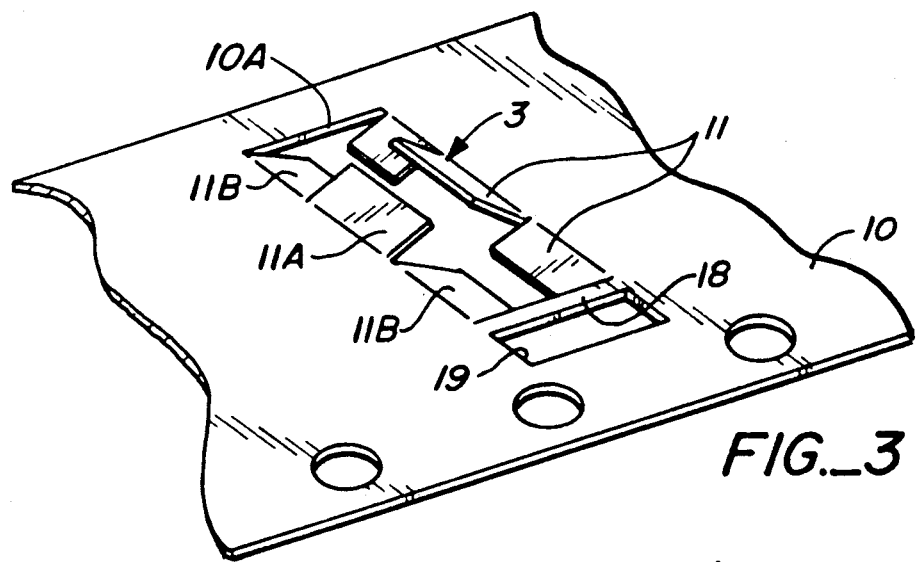
FIG._3
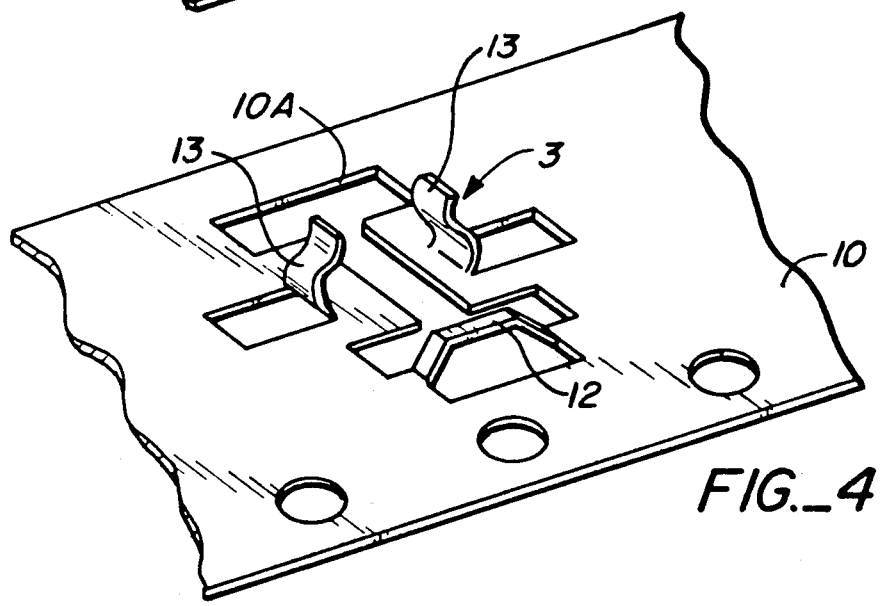
FIG._4
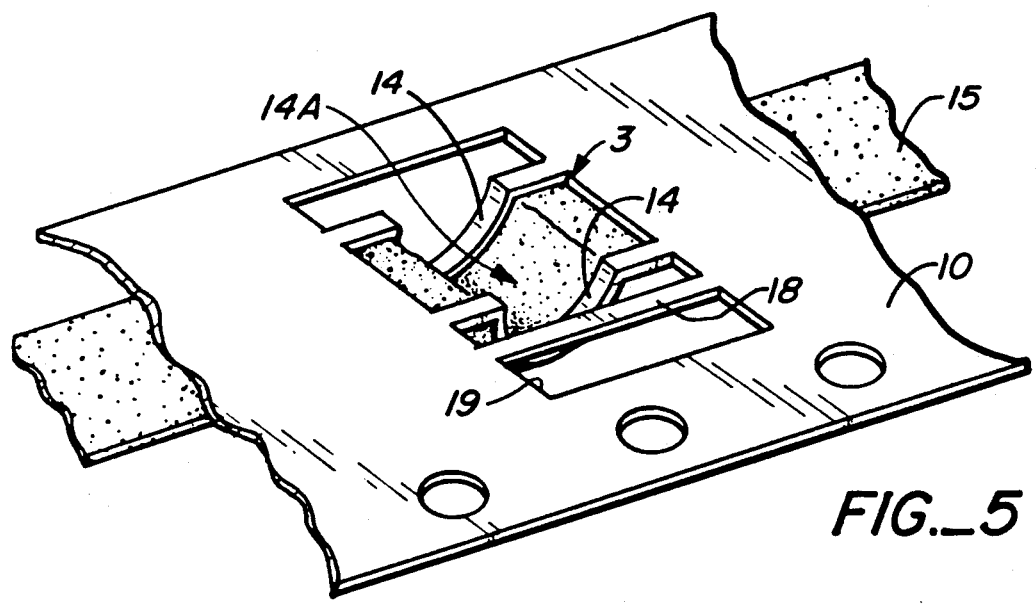
FIG._5

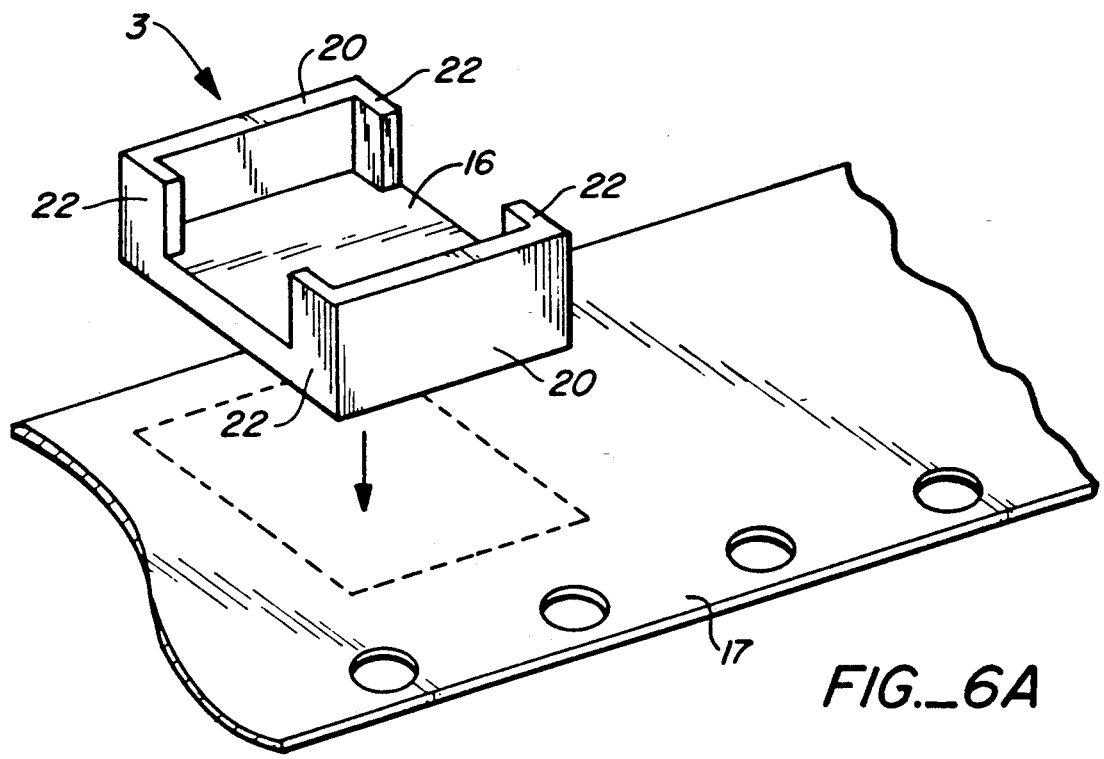
FIG._6A
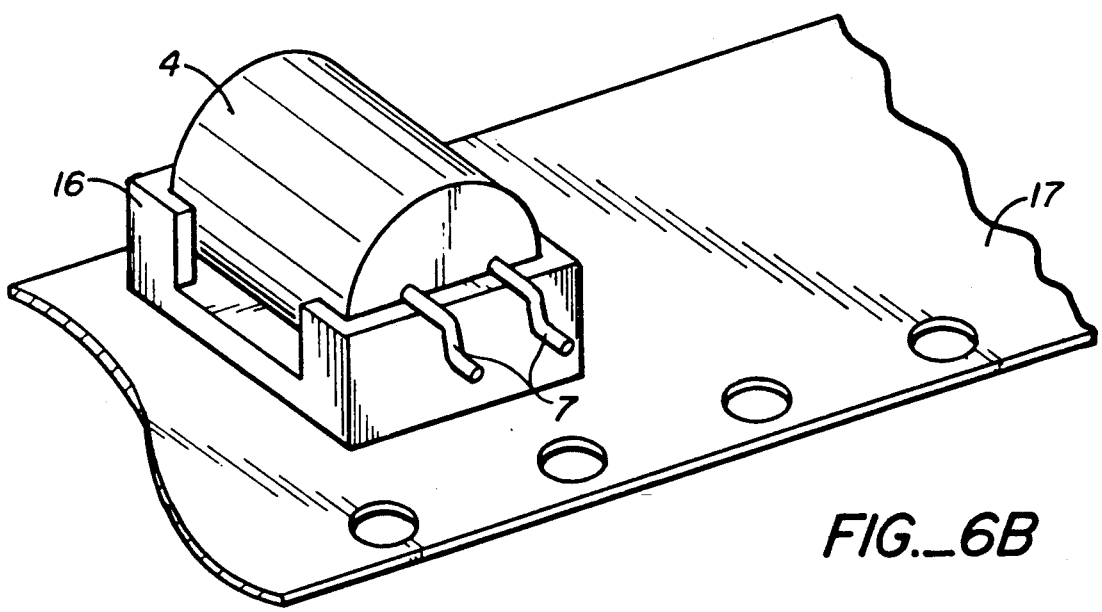
FIG._6B

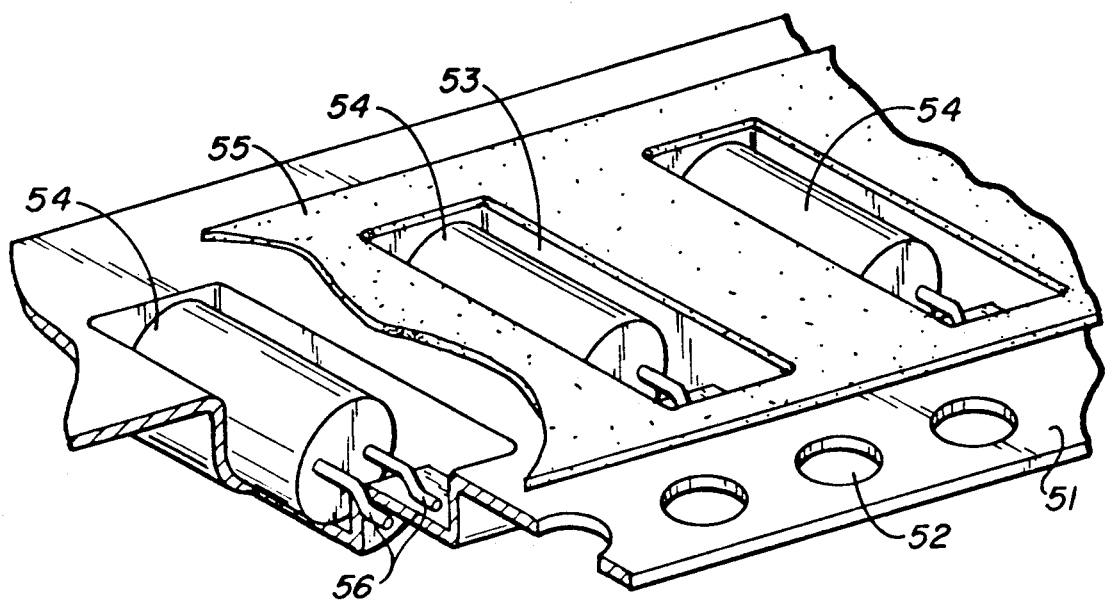
FIG._7A
(PRIOR ART)
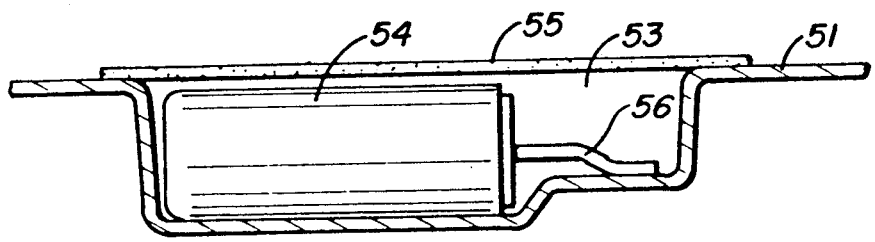
FIG._7B
(PRIOR ART)
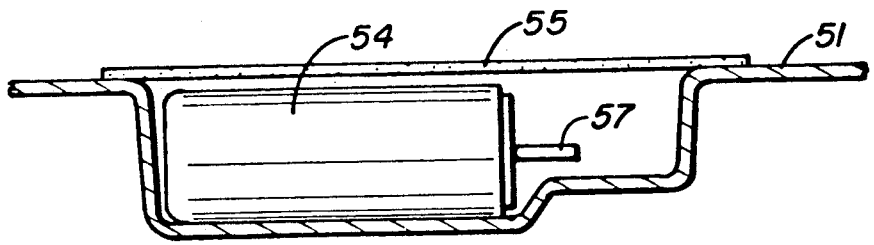
FIG._7C
(PRIOR ART)

tion functions to predetermine and set the proper rotational position or orientation of the electronic component taking into consideration the contour and shape of the component terminal leads.

By employing the integral component engaging means of this invention, precise and maintained positional relationships desired of the electronic components on transport carrier tape within the provided recesses can be achieved. Secondly, repositioning of the transport carrier tape during feeding of the component supported transport carrier tape via a feeding mechanism to an automated assembly or mounting machine is not required. Third, a precision repositioning means is not required in the feed apparatus thereby simplifying the overall construction of the transport carrier tape feed apparatus. Fourth, complex contours and shapes of electronic components, such as cylindrically shaped quartz vibrators, can be maintained in proper aligned position and axial orientation without interference due, for example, to subsequent handling of the transport carrier tape. Fifth, the transport carrier tape of this invention can be employed in the case wherein the dimensions of the transport carrier tape recess conform to component main body portion of the electronic components but the contour or preformed shape or length of the component terminal leads may be different for several such components employed in connection with the same transport carrier tape. Sixth, in those cases where the body portion of the component is cylindrical-like or contains angular or rounded portions together with a plurality of extended terminal leads, the integral component engaging means at the recesses of the transport carrier tape hold the component in a predetermined and desired angular orientation, posture, or position.

A particular application of this invention relates to the proper, predetermined alignment of components in the form of quartz vibrators or crystal oscillator elements relative to pickup means for subsequent automated assembly onto circuit boards. These components have cylindrically shaped main body portions but are required to properly aligned relative to their terminal leads when positioned for removal from the transport carrier tape. In the supply of crystal oscillator components in the process of assembly of a crystal oscillator element and a IC package on a substrate or circuit board including the soldering operation employed in connection with the assembly, it is a necessary to take into consideration that these elements are produced in low volume amounts and also involve several different types of oscillators each with a different oscillating frequency. In such cases, the integral component engaging means provided by this invention permits (1) precision positioning of the cylindrical oscillator components onto the transport carrier tape, (2) the maintenance of such precision positioning in spite of subsequent handling of the transport carrier tape, and (3) the accommodation on the same transport carrier tape of different types of oscillator components with different shaped and contour of terminal leads as well as possibly different lead lengths, thereby permitting the mixing together on the same transport carrier tape of low volume produced electronic components having different operating characteristics. This, in turn, permits a reduction in manufacturing costs in the assembly of such components resulting in a cost savings in the ultimate product in which the oscillator elements are employed.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a perspective view of a transport carrier tape illustrating a first embodiment for integral component engaging means comprising this invention.

FIGS. 2A and 2B are side elevations of the transport carrier tape of FIG. 1 respectively employing different types of electronic components having different terminal lead contours or shapes and different terminal lead lengths.

FIG. 3 is a perspective view of a transport carrier tape illustrating a second embodiment for integral component engaging means comprising this invention.

FIG. 4 is a perspective view of a transport carrier tape illustrating a third embodiment for integral component engaging means comprising this invention.

FIG. 5 is a perspective view of a transport carrier type illustrating a fourth embodiment for integral component engaging means comprising this invention.

FIGS. 6A and 6B are perspective views of a transport carrier tape illustrating a fifth embodiment for integral component engaging means comprising this invention.

FIGS. 7A, 7B and 7C are schematic diagrams illustrating a conventional transport carrier tape. FIG. 7A is a perspective view while FIGS. 7B and 7C are cross sectional views employing electronic components having different shaped and length terminal leads.

DESCRIPTION OF THE PREFERRED EMBODIMENTS

Reference is now made to FIG. 1 wherein there is illustrated a perspective view of transport carrier tape 1 comprising a first embodiment of this invention. Transport carrier tape 1 is fabricated of metal, such as, phosphor bronze, with a thickness in the range of about 0.1 mm to 0.2 mm. Tape 1 contains a longitudinal series of spatially positioned recesses in the form of apertures 1A formed via a stamping process forming an "I" shaped contour. Part of the stamping operation includes the formation of integral component engaging means 3 at opposite ends of each aperture 1A. Transport carrier tape 1 also contains positioning sprocket or indexing holes 2 for feeding tape 1. Integral component engaging means 3 are positioned relative to sprocket holes 2 for proper alignment of cylindrically shaped electronic components 4, e.g. quartz vibrators or crystal oscillator elements, which have preformed or contoured leads 7.

Integral component engaging means 3 in this embodiment are formed by punching and bending, such as, by means of a press to form vertical wall and flange portions 5 and 6, which portions are preformed from the metal material of transport carrier tape 1. The preformed end wall portions 5 and side flange portions 6 are provided at opposite longitudinal ends of each aperture 1A and electronic component 4 is mounted lengthwise between end wall portions 5 of aperture 1A. The spacing between oppositely opposed end walls 5 is nearly the same as the length of component 4 and the width of the spacing between pairs of facing side flange portions 6 is nearly the same as the width of component 4. In the particular case of quartz vibrators, the spacing between end walls 5 may be set, for example, to a dimension in the range of about 10 $\mu$m to 100 $\mu$m greater

TRANSPORT CARRIER TAPE WITH INTEGRAL COMPONENT ENGAGING MEANS

BACKGROUND OF THE INVENTION

This invention relates generally to electronic component supporting transport carrier tape having recesses, e.g., pockets or apertures, for accommodating such components and more particularly to a component supporting transport carrier tape having recesses with integral component engaging means to firmly hold and support such components for final assembly into a product such as by an automated assembly or mounting machine.

FIGS. 7A-7C illustrate a conventional transport carrier tape 51 for supporting electronic components 54, such as, in the case shown for quartz vibrators or crystal oscillator elements. Transport carrier tape 51 is constructed from suitable material, such as, paper, cardboard or synthetic resin, and includes a series of cavities or pockets 53 at uniform spatial intervals in the longitudinal direction of tape 51. Transport carrier tape 51 also includes sprocket or indexing holes 52 which are set at a predetermined pitch relative to pockets 53 so that accurate positioning of pockets 53 can be determined relative to the operation and feeding of tape 51 via a component filling machine, or a component assembly or mounting machine. Pockets 53 have side wall dimensions that allow for the easy and unhindered support of electronic components 54 within the pocket. In other words, the shape of pockets 53 is generally configured to the shape of components 54 but the dimensions of pockets 53 are made larger in order to reduce the risk of jamming or angular tilting of components 54 in pockets 53, which may, for example, be caused during subsequent carrier tape transport or usage. This is also particularly true relative to terminal leads 56 and 57, which, respectively, may have different contours or shapes and different lead lengths as illustrated in FIGS. 7B and 7C. Thus, the length of pockets 53 are sufficient to accommodate for different lead lengths.

After components 53 have been placed into pockets 54, cover tape 55 is applied over the surface of transport carrier tape 51 by means of adhesion either by, for example, pressure adhesive or by applied heat and pressure in order to retain components 54 within pockets 53 until removed by a tool mechanism associated with the automated assembly or mounting machine.

Because transport carrier tape 51 is formed with pockets 53 having sufficiently larger dimensions than the outer dimensions or size of electronic component 54 contained in pockets 53, it is necessary to remove component 54 from pockets 53 by means of a vacuum pickup mechanism in the automated assembly or mounting machine to thereafter transfer the component for positioning relative to or insertion into a product being assembled. Furthermore, many such electronic components have cylindrically shaped main bodies or have bodies with rounded portions so that after such components have been accurate prepositioned in pockets 53, they can rotate or become angularly or axially misaligned in pockets 53 due to subsequent handling and, therefore, are not properly aligned for vacuum pickup and insertion into product. Therefore, it is necessary to employ a second positional adjustment process to position the components accurately in the feeder mechanism of such automated assembly machines in advance of positioning and setting the components into product, such as, on a circuit substrate or the like. In particular, the components remain roughly positioned in recesses 53 of transport carrier tape 51 and are, thereafter, transported by the pickup mechanism to an intermediate positioning and alignment jig in the feeder mechanism wherein the pickup mechanism deposits the component on the jig, which functions to properly align and orient the component relative to the pickup mechanism. Then, the pickup mechanism again picks up the component for transfer in the feeder mechanism to the site of the product for its properly prealigned and oriented insertion into the product.

Moreover, it is necessary to first remove cover tape 55 to provide for convenient access to components 54 for subsequent vacuum pickup and insertion into the product via an assembly machine. Also, many electronic components having a plurality of terminal leads extending from the main body of the component so that the pockets of the transport carrier tapes are, in many cases, especially designed to accommodate the component leads as well as the component body thereby requiring especially designed and manufactured transport carrier tapes.

It is an object of this invention to eliminate or mitigate the foregoing problems through the provision of an improved electronic component transport carrier tape.

It is another object of this invention to provide a transport carrier tape construction with sufficient security for maintaining an accurate positional relationship of the electronic components relative to their transport carrier tape recesses thereby making it unnecessary for a second positional adjustment process relative to the feed mechanism in an automated assembly and mounting machine.

It is a further object of this invention to provide a transport carrier tape that can accommodate electronic components having terminal leads with different preformed and contoured lead shapes and lead lengths.

It is a further object of this invention to provide a transport carrier tape that accommodates on the same transport carrier tape different types of low volume produced electronic components having different operating characteristics thereby permitting a reduction in product assembly costs.

It is a further object of this invention to provide a transport carrier tape that does not require a cover tape.

SUMMARY OF THE INVENTION

According to this invention, a component supporting transport carrier tape having a plurality of spatially positioned recesses along the longitudinal length of the tape comprises integral component engaging means to firmly hold and support electrical or electronic components for maintained accurate alignment relative to the transport carrier tape recesses and sprocket holes and for removal from the transport carrier tape and final assembly into a product The integral component engaging means provides for minimal engagement with the electronic component within the tape recess, which engagement is sufficient to hold the component with minimal contact with and coverage of the component body but with sufficient surface engagement to hold the component securely in proper positional relationship and axial alignment relative to component removal means to provide for its accurate, aligned removal by such means and assembly into product. Furthermore, the integral component engaging means of this inventhan the length of the vibrator and the width of the spacing between facing flange portions 6 may be set to a dimension in the range of about 10 μm to 100 μm greater than the width of the vibrator. The spaced relation and curved contour shape of the two terminal leads 7 provide for maintained proper angular or axial positional alignment and orientation of component 4 as supported within the framework of integrated component engaging means 3. Adhesive tape 8 is applied to the back surface of transport carrier tape 1 in order to retain electronic components 4 secure on transport carrier tape 1 until their subsequent removal by an automated assembly or mounting machine. However, if integral component engaging means 3 provides a fairly snug fit for components 4, then adhesive tape 8 may not be required.

FIGS. 2A and 2B illustrate two different electronic components 4 having different shaped terminal leads &A and 7B as well as different lead lengths and illustrates that transport carrier tape 1 may easily accommodate components with different lead contours and lengths. Transport carrier tape 1 of this embodiment, therefore, may be employed in connection with both situations wherein the distances in terminal leads from the quartz vibrator container to their bent portions are different, or the lengths of the terminal leads are different.

FIG. 3 discloses a second embodiment for integral component engaging means 3 of this invention comprising flange members or projections 11. Transport carrier tape 10 contains a series of apertures 10A along its longitudinal length and the cut portions forming aperture 10A are not removed along the longitudinal ledges of aperture 10A so that a series outwardly extended flange members 11A and 11B may be formed along the longitudinal extent of aperture 10A. These members 11 are formed by punching and bending, such as, by means of a press, to provide for a series flange members 11A that are bent upwardly and a series flange members 11B that are bent downwardly. An electronic component 4 may then be held within the grip of members 11A and 11B with component 4 nested between members 11A and members 11B. The longitudinal extent of aperture 10A may approximate the length of electronic component 4. The nesting of the component relative to aperture 10A as held between members 11A and 11B aids in preventing subsequent axial misalignment of the component for proper pickup by assembly machine pickup means for insertion in proper alignment into a product. Terminal leads 7 of components 4 would rest on or be positioned above or overhand strip 18 and aperture 19 would provide a space for accommodating the bent contour of leads 7. Strip 18 may also function to maintain the proper aligned angular or axial orientation of the component, i.e., so that component 4 will not easily rotate within nesting flange members 11 during tape transport, either from one location to another or as fed by a feeding mechanism in an assembly or mounting machine.

FIG. 4 discloses a third embodiment for integral component engaging means 3 of this invention comprising oppositely opposed, curved vertical spring projections 13 punched out and bent from the material of transport carrier tape 10. Projections 13 having spring like properties to engage therebetween component 4. Component 4 may nest on I-shaped 10A and is firmly held in position by means of spring projections 13. The nesting of the component on aperture 10A aids in preventing subsequent axial misalignment of the component for proper pickup by assembly machine pickup means for insertion in proper alignment into a product. Terminal leads 7 of components 4 may be aligned over or on bridge support member 12 to maintain the axial orientation of the component, i.e., so that component 4 nested on aperture 10A between spring projections 13 will not easily rotate within the grasp of projections 13 during tape transport. Member 12 may be formed by punching and upward extension and bending, such as, by means of a punch press.

FIG. 5 disclosed a fourth embodiment for integral component engaging means 3 of this invention comprising one or more downwardly formed concave members 14 forming a subsurface concavity 14A for supporting a component 4 therein. The longitudinal extent of aperture 10A may approximate the length of electronic component 4. If desired, an adhesive tape 15 may be applied to the back surface of transport carrier tape 10 to help retain the nested components within the formed concavity 14A. Leads 7 of component 4 would rest on or be positioned above or overhand strip 18 and aperture 19 would provide a space for accommodating the bent contour of leads 7. Strip 18 would also function to maintain the proper aligned angular or axial orientation of the component, i.e., so that component 4 will not easily rotate within concavity 14A during tape transport.

FIG. 6 discloses a fifth embodiment for integral component engaging means 3 of this invention comprising a separate component container 16 which may be secured to transport carrier tape 17. As shown in FIG. 6A, container 16 comprises recess formed by end wall portions 20 and side flange portions 22 at opposite ends of container 16 between which is supported component 4 in a manner similar to that shown in the first embodiment of FIG. 1. Thus, the functionality of wall and flange portions 20 and 22 is the same as wall and flange portions 5 and 6 in FIG. 1. The spacing between oppositely opposed end walls 20 is nearly the same as the length of component 4 and the width of the spacing between pairs of facing side flange portions 20 is nearly the same as the width of component 4. The spaced relation and curved contour shape of the two terminal leads 7 of component 4 provide for maintained proper angular or axial positional alignment and orientation of component 4 as supported within the framework of integrated component engaging means 3. Thus, as illustrated in FIG. 6B, portions 20 and 22 of container 16 provide a fairly secure fit for components 4 so that a cover tape or an adhesive tape holding member is not be required.

When extracting or removing electronic components 4 from the transport carrier tape of any one of the embodiments of this invention, the exposed portions of the main body of electronic component 4 may be grasped with precision by means of a suitable extraction mechanism employed with an automated assembly or mounting machine.

While the invention has been described in conjunction with several specific embodiments, it is evident to those skilled in the art that many further alternatives, modifications and variations will be apparent in light of the forgoing description. For example, while the forgoing invention has been described particularly relative to the support and transport of quartz vibrators or crystal oscillator elements, the transport carrier tape of this invention is also useful as a transport carrier tape for other types of electronic components, such as electrolytic condensers, capacitors, resistances and transistors, wherein the electronic components have different shaped geometries. Thus, the invention described herein is intended to embrace at such alternatives, modifications, applications and variations as fall within the spirit and scope of the appended claims.

What is claimed is:

1. A component supporting transport carrier tape for holding a plurality of electrical or electronic components having one or more extended terminal leads for subsequent removal from said tape by pickup means, and comprising.

a plurality of spatially positioned recesses formed along the longitudinal length thereof.

integral component engaging means formed with respect to each of said recesses to provide in cooperation with said recess for substantially fixed positioning and maintained axial orientation of said component relative to said recess.

said integral component engaging means having limited surface engagement of said component permitting sufficient surface exposure thereof for engaged removal by said pickup means but having sufficient surface engagement of said component to maintain said fixed positioning and orientation and prevent its removal from said transport carrier tape until removed by said pickup means said integral components engaging means comprising flange members formed along opposite along opposite sides of the longitudinal extent of said recess, some of said flange members bent downwardly below a major surface of said tape and some of said flange members bent upwardly above a major surface of said tape, said component nested between said downwardly and upwardly bent flange members.

2. The component supporting transport carrier tape of claim 1 wherein said recesses are apertures in said tape and said flange members are formed from tape material forming said apertures.

3. The component supporting transport carrier tape of claim 2 wherein said transport carrier tape is made of metal.

4. The component supporting transport carrier tape of claim 3 wherein said transport carrier tape is made of phosphor bronze.

5. The component supporting transport carrier of claim 1 further including another plurality of spatially positioned recesses formed along the longitudinal length of said tape and aligned laterally adjacent to said first mentioned spatially positioned recesses to form laterally adjacent pairs of recesses, a strip formed between said laterally adjacent pairs of recesses, said component leads supported over said strip with said leads extending into said another spatially positioned recesses to aid in the prevention of axial rotation of said component within the confines of said integral component engaging means.

6. A component supporting transport carrier tape for holding a plurality of electrical or electronic components having extended terminal leads from the ends thereof for subsequent removal from said tape by pickup means, and comprising a plurality of spatially positioned recesses formed along the longitudinal length thereof, integral component engaging means formed with respect to each of said recesses to provide in cooperation with said recess for substantially fixed positioning, terminal lead engagement means formed adjacent one end of each of said recesses and having a planar surface substantially parallel with the plane of said carrier tape to permit positioning of said extended terminal leads thereon to maintain fixed axial orientation of said component relative to said recess, said integral component engaging means having limited surface engagement along opposite side portions of said component leaving the top portions thereof exposed for engaged removal by said pickup means but having sufficient surface engagement of said component to maintain said fixed positioning and orientation and prevent its removal from said transport carrier tape until removed by said pickup means.

said integral component engaging means comprises at least one spring projection formed along opposite sides of the longitudinal extent of said recesses and extending above a major surface of said tape, said spring projections being formed in opposite opposed relation to one another to grasp said component therebetween with said component nested between said spring projections relative to said recess, another plurality of spatially positioned recesses formed along the longitudinal length of said tape and aligned laterally adjacent to said first mentioned spatially positioned recesses to form laterally adjacent pairs of recesses, a strip formed between said laterally adjacent pairs of recesses, said component leads supported over said strip with said leads extending into said another spatially positioned recesses to aid in the prevention of axial rotation of said component within the confines of said integral component engaging means.

7. A component supporting transport carrier tape for holding a plurality of electrical or electronic components having extended terminal leads from the ends thereof for subsequent removal from said tape by pickup means, and comprising a plurality of spatially positioned recesses formed along the longitudinal length thereof, integral component engaging means formed with respect to each of said recesses to provide in cooperation with said recess for substantially fixed positioning.

terminal lead engagement means formed adjacent one end of each of said recesses and having a planar surface substantially parallel with the plane of said carrier tape to permit positioning of said extended terminal leads thereon to maintain fixed axial orientation of said component relative to said recess.

said integral component engaging means having limited surface engagement along opposite side portions of said component leaving the top portions thereof exposed for engaged removal by said pickup means but having sufficient surface engagement of said component to maintain said fixed positioning and orientation and prevent its removal from said transport carrier tape until removed by said pickup means said integral component engaging means comprises flange members formed along opposite sides of the longitudinal extent of said recess, some of said flange members bent downwardly below a major surface of said tape and some of said flange members bent upwardly above a major surface of said tape.

said component nested between said downwardly and upwardly bent flange members.

8. The component supporting transport carrier tape of claim 7 wherein said recesses are apertures in said tape and said flange members are formed form tape material forming said apertures.

9. The component supporting transport carrier tape of claim 8 wherein said transport carrier tape is made of metal.

10. The component supporting transport carrier tape of claim 9 wherein said transport carrier tape is made of phosphor bronze.

11. The component supporting transport carrier tape of claim 7 further including another plurality of spatially positioned recesses formed along the longitudinal length of said tape and aligned laterally adjacent to said first mentioned spatially positioned recesses to form laterally adjacent pairs of recesses, a strip formed between said laterally adjacent pairs of recesses comprising said terminal lead engaging means, said component leads supported over said strip with said leads extending into said another spatially portioned recesses to aid in the prevention of axial rotation of said component within the confines of said integral component engaging means.

12. The component supporting transport carrier tape of claim 7 wherein said integral component engaging means comprising at least one spring projection formed along opposite sides of the longitudinal extent of said recesses and extending above a major surface of said tape, said spring projections being formed in opposite opposed relation to one another to grasp said component therebetween with said component nested between said spring projections relative to said recess.

13. The component supporting transport carrier tape of claim 12 wherein said recesses are apertures in said tape and said spring projections are formed of tape material from said apertures.

14. The component supporting transport carrier tape of claim 13 wherein said transport carrier tape is made of metal.

15. The component supporting transport carrier tape of claim 14 wherein said transport carrier tape is made of phosphor bronze.

16. The component supporting transport carrier tape of claim 12 further including another plurality of spatially positioned recesses formed along the longitudinal length of said tape and aligned laterally adjacent to said first mentioned spatially positioned recesses to form laterally adjacent pairs of recesses, a strip formed between said laterally adjacent pairs of recesses comprising said terminal lead engaging means, said component leads supported over said strip with said leads extending into said another spatially positioned recesses to aid in the prevention of axial rotation of said component within the confines of said integral component engaging means.

* * * * *